United States Patent [19]

Moroney

[11] 3,711,745

[45] Jan. 16, 1973

[54] LOW BARRIER HEIGHT GALLIUM ARSENIDE MICROWAVE SCHOTTKY DIODES USING GOLD-GERMANIUM ALLOY

[75] Inventor: William J. Moroney, Wenham, Mass.

[73] Assignee: Microwave Associates, Inc., Burlington, Mass.

[22] Filed: Oct. 6, 1971

[21] Appl. No.: 187,053

[52] U.S. Cl. ........................317/235 R, 317/235 UA
[51] Int. Cl. ................................................H01l 3/20
[58] Field of Search...............................317/234, 235

[56] References Cited

UNITED STATES PATENTS

| | | | |
|---|---|---|---|
| 3,657,615 | 4/1972 | Driver | 317/235 |
| 3,586,542 | 6/1971 | MacRae | 148/1.5 |

*Primary Examiner*—John W. Huckert
*Assistant Examiner*—E. Wojciechowicz
*Attorney*—Alfred H. Rosen and Frank A. Steinhelper

[57] ABSTRACT

A gallium-arsenide Schottky barrier diode for microwave mixing and detecting with small local oscillator power has a rectifying metal-semiconductor contact made of an eutectic alloy of gold and germanium formed on the GaAs substrate while the latter is at a temperature below the eutectic for the Au-Ge alloy.

10 Claims, 2 Drawing Figures

Figure 1:
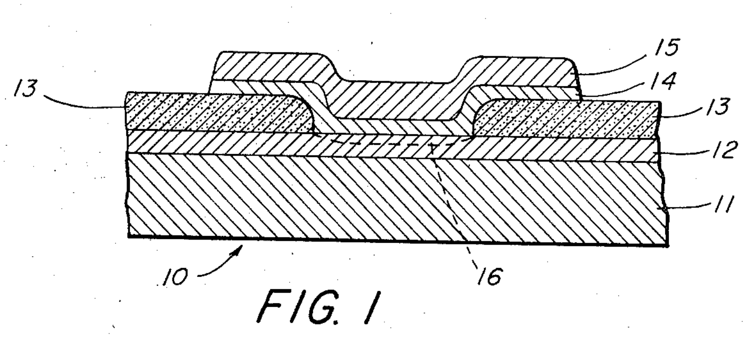

LOW BARRIER HEIGHT GALLIUM ARSENIDE MICROWAVE SCHOTTKY DIODES USING GOLD-GERMANIUM ALLOY

BACKGROUND OF THE INVENTION

This invention relates to Schottky barrier diodes that are characterized by low barrier height and high sensitivity, suitable for use as a microwave mixer and detector in a system using a low power local oscillator.

The Schottky-barrier diode is a rectifying metal-semiconductor junction formed by plating, evaporating, or sputtering a variety of metals on n-type or p-type semiconductor materials. Generally, n-type silicon and n-type GaAs are used. Due to higher cutoff frequency, GaAs devices are preferred in applications above X-band frequencies. This results from the higher mobility of electrons in GaAs than in silicon. Although in practice this advantage is not as significant as predicted, conversion loss improvement of 0.5 dB at $K_u$ band is readily obtainable with GaAs over silicon.

The Schottky diodes are fabricated by a planar technique. A $SiO_2$ layer (10,000 A) is thermally grown or deposited on the semiconductor wafer and windows are etched in the $SiO_2$ by photolithography techniques. Schottky junctions are formed by evaporation, sputtering, or plating techniques. Metal on the oxide is removed by a second photo step. Junction diameters as small as 5$\mu$ are made by this techniques. The metal forming the junction is continuous over the oxide immediately around the junction. This approach maintains the required clean interface between the metal edge and the semiconductor and exhibits low 1/f noise.

In the early days of radio the crystal rectifier was almost universally used as a detector. Although replaced by the thermionic valve, it returned ( in the preferred form of the point contact silicon diode) to replace thermionic mixer valves in microwave receivers owing to its superior low noise performance at microwave frequencies. Now GaAs Schottky-barrier diodes are available which exhibit equally attractive noise performance (e.g.: < 6 dB at Ku band), but prior to the present invention they have been characterized by barrier heights that are substantially higher than those of point contact silicon diodes and greater than those of most silicon Schottky diodes, resulting in a requirement of high local oscillator power for operation of mixers. The barrier height determines the rf local oscillator power required to obtain optimum performance. Consequently, in microwave systems having limited local oscillator power, a low barrier height device is required.

According to the present invention, a gold-germanium alloy is applied to n-type gallium arsenide single crystal of proper resistivity in a manner which results in a low barrier height Schottky diode. While alloys based on gold and silver have heretofore been developed for use as ohmic contacts to GaAs transistors and diodes (see for example: Breslau, Gunn and Staples "Metal-Semiconductor Contacts for GaAs Bulk Effect Devices" - Solid-State Electronics, Pergamon Press 1967, Vol. 10, pp. 381–383; and Cox and Strack "Ohmic Contacts for GaAs Devices" ibid, Vol. 10, pp. 1,213–1,218, this alloy has not heretofore, to my knowledge, been employed to form a rectifying junction with gallium arsenide.

Metal-semiconductor contacts can be ohmic or rectifying. Those made on heavily doped semiconductors are generally ohmic. The contacts made on lightly doped material result in rectifying behavior with an energy barrier existing between the metal and the semiconductor. A eutectic alloy of gold and germanium, melting at 330° C, has been used by Breslau et al (ibid) to form n+ ohmic contacts on GaAs by vacuum evaporation while holding the GaAs substrate at an alloying temperature above the eutectic—in the range from 350°–450° C. The resulting product is not fully identified, differs in color from the Au-Ge eutectic, and is not entirely satisfactory. The alloy found satisfactory consists of gold, germanium and nickel, and the processing temperature in the oven is between 450° and 480° C.

According to the present invention, a gold germanium eutectic alloy is formed on the GaAs body while the latter is held at a temperature below the eutectic, between 200° C and 300° C, and thereby forms a Schottky diode having a barrier height that is between approximately 0.2 and 0.4 volts, although at lower temperatures (as low as about 25° C) a barrier height about 0.9 volt may be realized.

It is an object of this invention to provide a GaAs Schottky barrier diode characterized by low barrier height, suitable for mixing and detecting at microwave frequencies.

Another object is to provide such a diode that will have a low local oscillator power requirement for optimum performance.

Another object of the invention is to provide a GaAs Schottky barrier diode that is suitable for use in battery-operated microwave receiver and radar equipment.

Still another object of the invention is to provide such a diode that can be fabricated using known techniques and can be used in the currently-available packages and circuit configurations.

DESCRIPTION OF AN EMBODIMENT

Figure 2:
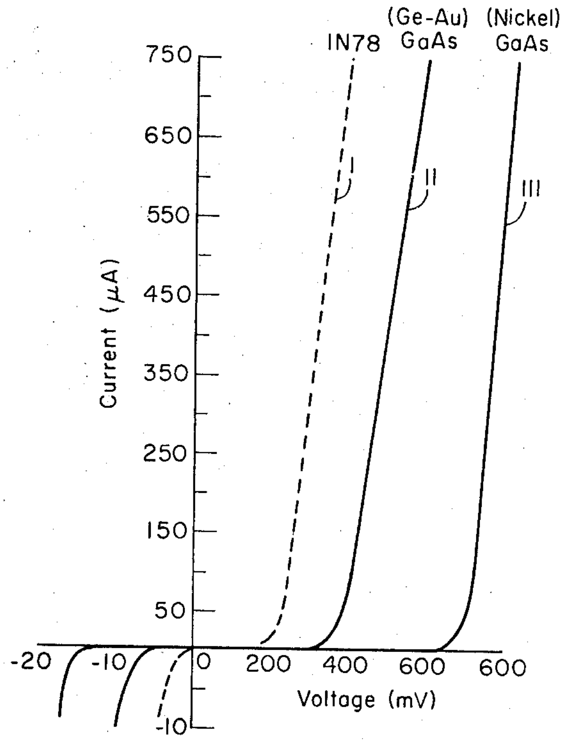

An exemplary embodiment of the invention is described with reference to the accompanying drawings, in which:

FIG. 1 is a schematic cross-section of a gold-germanium alloy GaAs Schottky barrier mixer diode; and FIG. 2 is a set of curves comparing the current against voltage characteristics of the diode of FIG. 1 and a typical IN78 point contact silicon diode.

Diodes 10 as shown in FIG. 1 were fabricated by the vacuum evaporation of hyperpure gold-germanium eutectic alloy (88 weight % Au and 12 weight % Ge). The Au-Ge alloy was obtained in the form of ribbon 0–25 inches by 0–020 inches. Evaporations were performed in an oil diffusion pumped vacuum system at a pressure of $1 \times 10^{-6}$ torr. Tungsten wire basket type filaments were used for the evaporations, and were outgassed at white heat in vacuum before use. The temperature was monitored by resting a thermocouple directly on the carbon boat. A shutter was used between the filament and the gallium arsenide wafer; the shutter was opened after the alloy wetted the filament. The film thickness after evaporation was measured using a Sloan Dektak (surface profilometer).

The epitaxial *n* on *n*+ gallium arsenide wafer 12, 11 was prepared for the $SiO_2$ layer by first chemically cleaning in organic and inorganic solvents. A layer of $SiO_2$ 13 is grown by reacting silane and oxygen at 450° C until a thickness of 8,000 A thickness is obtained. Windows 7.5 $\mu$m in diameter were etched in the oxide using a photoresist mask and a buffered hydrofluoric acid etch. The wafers were cleaned in an organic solvent immediately before evaporation.

The alloy 14 was evaporated to a thickness of 1,000 A with the slice held at a temperature between 200° C and 300° C, for a time on the order of one minute. The stated thickness of the gold-germanium layer is important only in that contact must be made to it, as by the gold layer 15. The barrier formation is dependent essentially on the time and temperature maintained in its formation.

Using a photoresist process, a second mask defines an area 12.5 $\mu$m diameter centered on the original areas. Unwanted Au-Ge was then etched. The contact areas were then plated with 5,000 A of gold 15. Ohmic contact to the *n*+ side (not shown) is obtained by evaporating Au-Ge at 200° C, on an area that is, for example, $16 \times 10^4$ microns$^2$.

The gallium arsenide substrate used in this work was boat grown, tellurium-doped with (100) orientation. The doping level was between $7 \times 10^{17}$ and $1 \times 10^{18}$ atoms $cm^{-3}$. Wafer preparation for epitaxial growth consisted of etching in a rotating beaker using $H_2SO_4$ : $H_2O_2$ : $H_2O$ (3 : 1 : 1) with an etch rate of 2 $\mu$m per minute.

The epitaxial layer 12 was grown by the conventional $AsCl_3$ process. The layer carrier concentration and thickness were evaluated by fabricating large diameter (250 $\mu$m) gold Schottky diodes and analyzing dc/dv data.

Forward and reverse I–V characteristics of (Au-Ge)-n GaAs; Ni-n GaAs Schottky barrier and point contact (IN78) diodes are shown in FIG. 2. (Au-Ge)-n GaAs and Ni-n GaAs Schottky diodes were made on epitaxial film with carrier concentration of on the order of $1 \times 10^{16}$ atoms $cm^{-3}$ (in this case $7 \times 10^{15}$ atoms $cm^{-3}$) and thickness of 0.5 $\mu$m and the Schottky chip was then put in the standard IN78 coaxial package (not shown). The alloy Schottky barrier diodes exhibited barrier height, $\phi_B$ and $V_B$ decreasing with increasing substrate temperatures. Forward conductance starts 0.25 to 0.3 V for (Au-Ge) 300° C and 0.35 to 0.40 for (Au-Ge) 200° C, as shown in curve II. Curve I shows the properties of the IN78 point contact diode. The reverse breakdown voltages are 5 Volts and 7 Volts, respectively. The Ni-n GaAs Schottky barrier diode data at curve III is included for comparison purposes.

Measurements on the diodes described have shown that the low barrier Au-Ge Schottky barrier diodes exhibit similar rf and if impedance to the IN78 point contact silicon diode, with exceptionally low noise figure (5.3 dB, for example) at J-Band frequencies.

Study of the contact interface between the Au-Ge alloy and Ga-As epitaxial layer 12 with the aid of electron scanning photographs shows a step between the protected area of the epitaxial layer 12 under the $SiO_2$ layer 13 and the Au-Ge portion penetrating into the window in the $SiO_2$ layer, as represented by the dashed line 16. This suggests a penetration into the Ga-As, possibly through a gold-gallium or gold-germanium-gallium arsenide reaction.

The control of barrier height according to the present invention is applicable to devices other than diodes, for example, to gallium arsenide field-effect transistors. While as stated, junction formation at substrate temperatures between 200° C and 300° C has yielded optimum results (desired low barrier in forward direction and low leakage currents at reverse bias ), low barrier formation can be achieved at temperatures that may even be somewhat above the Au-Ge eutectic, but if the temperature approaches about 400° C the contact tends to be ohmic (see Breslau et al., ibid).

I claim:

1. A gallium arsenide Schottky barrier diode for microwave mixing and detecting with small local oscillator power comprising a body of n-type gallium arsenide single crystal having "n+" substrate doped to a level on the order of $1 \times 10^{18}$ atoms $^{-3}$ and on the substrate an epitaxial "n" layer with carrier concentration on the order of $1 \times 10^{16}$ atoms $cm^{-3}$, and a rectifying metal-semiconductor contact made of an alloy of gold and germanium formed on said epitaxial layer while said body is at a temperature below the eutectic for said alloy.

2. A diode according to claim 1 having forward conductance starting in the range approximately 0.2 to 0.4 volt.

3. A diode according to claim 1 in which said epitaxial layer is approximately 0.5 micrometer thick.

4. A diode according to claim 1 in which said alloy is in a layer approximately 1,000 Angstrom units thick.

5. A gallium arsenide Schottky barrier junction comprising a body of "n" type gallium arsenide with carrier concentration on the order of $1 \times 10^{16}$ atoms $cm^{-3}$ and a rectifying metal-semiconductor contact made of an alloy of gold and germanium formed therein while said body is at a temperature below the eutectic for said alloy.

6. A gallium arsenide Schottky diode having forward conductance starting in the range substantially 0.2 to 0.4 volt comprising a body of n-type gallium arsenide single crystal having "n+" substrate doped to a level between approximately $7 \times 10^{17}$ and $1 \times 10^{18}$ atoms $cm^{-3}$ and on the substrate an epitaxial "n" layer with carrier concentration about $7 \times 10^{15}$ atoms $cm^{-3}$ approximately 0.5 micrometer thick, a layer of silicon dioxide on said epitaxial layer with a window approximately 7.5 micrometers in diameter therethrough, and a layer approximately 1,000 Angstrom units thick of substantially hyperpure gold-germanium eutectic alloy consisting essentially of 88 weight % gold and 12 weight % germanium overlying said $SiO_2$ layer and in contact with said epitaxial layer through said window.

7. Method of making a gallium arsenide Schottky diode having forward conductance starting in the range approximately 0.2 to 0.4 volt comprising the steps of providing a body of n-type gallium arsenide single crystal having "n+" substrate doped to a level on the order of $1 \times 10^{18}$ atoms $cm^{-3}$, and on the substrate an epitaxial "n" layer with carrier concentration on the order of $1 \times 10^{16}$ atoms $cm^{-3}$, and depositing a layer of gold-germanium alloy into contact with said epitaxial layer while holding said body at a temperature below the eutectic of said alloy.

8. The method of claim 7 in which said body is held at a temperature between approximately 200° C. and 300° C.

9. Method of claim 7 in which during depositing of said alloy, said body is held at a temperature approximately room temperature, and after depositing is completed, said body is raised to a temperature between approximately 200° C. and 300° C. for approximately 1 minute.

10. The method of claim 9 in which said epitaxial layer is approximately 0.5 micrometer thick.

* * * * *

UNITED STATES PATENT OFFICE

CERTIFICATE OF CORRECTION

Patent No. 3,711,745 Dated January 16, 1973

Inventor(s) William J. Moroney

It is certified that error appears in the above-identified patent and that said Letters Patent are hereby corrected as shown below:

Column 1, line 28, change "techniques" to --technique-- line 65, after "1,213-1,218" insert --)--

Column 2, line 55, change "0-25" to --0.25-- line 56, change "0-020" to --0.020--

Column 3, line 4, change "is" to --was--

Column 4, line 19, change "$1 \times 10^{18}$ atoms $^{-3}$" to --$1 \times 10^{18}$ atoms $cm^{-3}$--

Signed and sealed this 25th day of June 1974.

(SEAL)
Attest:

EDWARD M.FLETCHER,JR.
Attesting Officer

C. MARSHALL DANN
Commissioner of Patents

USCOMM-DC 60376-P69
☆ U.S. GOVERNMENT PRINTING OFFICE : 1969 O—366-334.